(12) United States Patent
Ikeda

(10) Patent No.: US 8,231,404 B2
(45) Date of Patent: Jul. 31, 2012

(54) ELECTRONIC CONNECTION BOX

(75) Inventor: Hiromitsu Ikeda, Yokkaichi (JP)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 0 days.

(21) Appl. No.: 12/879,547

(22) Filed: Sep. 10, 2010

(65) Prior Publication Data

US 2011/0136377 A1 Jun. 9, 2011

(30) Foreign Application Priority Data

Dec. 7, 2009 (JP) ................................. 2009-277998

(51) Int. Cl.
*H01R 13/60* (2006.01)
(52) U.S. Cl. ...................................................... 439/540.1
(58) Field of Classification Search ............... 439/540.1, 439/676, 541.5, 404; 174/50
See application file for complete search history.

(56) References Cited

U.S. PATENT DOCUMENTS

| | | | | |
|---|---|---|---|---|
| 4,000,874 A | * | 1/1977 | Finley et al. | 248/27.1 |
| 4,255,637 A | * | 3/1981 | Matsuda | 200/293 |
| 5,695,362 A | * | 12/1997 | Hillbish et al. | 439/541.5 |
| 5,795,183 A | * | 8/1998 | Kameyama | 439/534 |
| 6,573,453 B2 | * | 6/2003 | Takada et al. | 174/72 A |
| 6,717,050 B2 | * | 4/2004 | Laflamme et al. | 174/50 |
| 6,739,915 B1 | * | 5/2004 | Hyland et al. | 439/676 |
| 6,838,207 B1 | * | 1/2005 | Sugita | 429/82 |
| 6,890,209 B2 | * | 5/2005 | Sawada et al. | 439/404 |
| 7,381,889 B2 | * | 6/2008 | Hara | 174/50 |
| 7,419,386 B2 | | 9/2008 | Washihira | |
| 7,481,682 B2 | * | 1/2009 | Murakami et al. | 439/701 |
| 2002/0030084 A1 | * | 3/2002 | Sawada et al. | 228/115 |
| 2002/0157848 A1 | * | 10/2002 | Chiriku et al. | 174/50 |

FOREIGN PATENT DOCUMENTS

JP 2007-181317 A 7/2007

\* cited by examiner

*Primary Examiner* — Jean F Duverne
(74) *Attorney, Agent, or Firm* — Oliff & Berridge, PLC

(57) ABSTRACT

An electric connection box includes: a case and a wired insulating plate with electric wires laid thereon and accommodated in the case. The electric wires are respectively connected to a plurality of press-contact terminals secured on the wired insulating plate, the plurality of press-contact terminals project to the outside through the case on the side of a front surface of the wired insulating plate. The case integrally includes connector peripheral wall portions configured to surround the plurality of press-contact terminals projecting to the outside. The electric connection box also includes joining and fixing portions positioned on both sides of an alignment of the plurality of press-contact terminals in the longitudinal direction that fix the wired insulating plate and the case with respect to each other.

7 Claims, 5 Drawing Sheets

[Fig. 1]
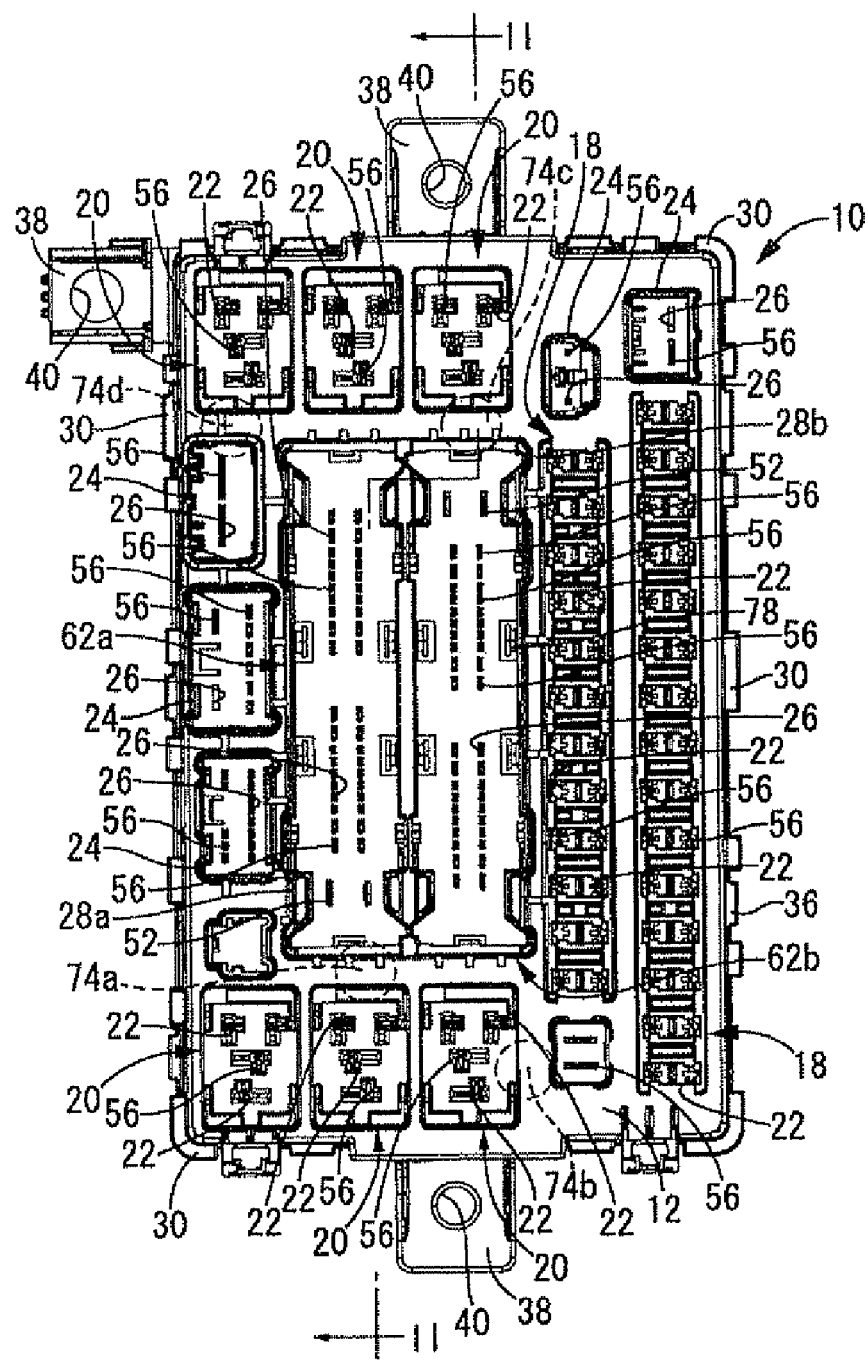

[Fig. 2]
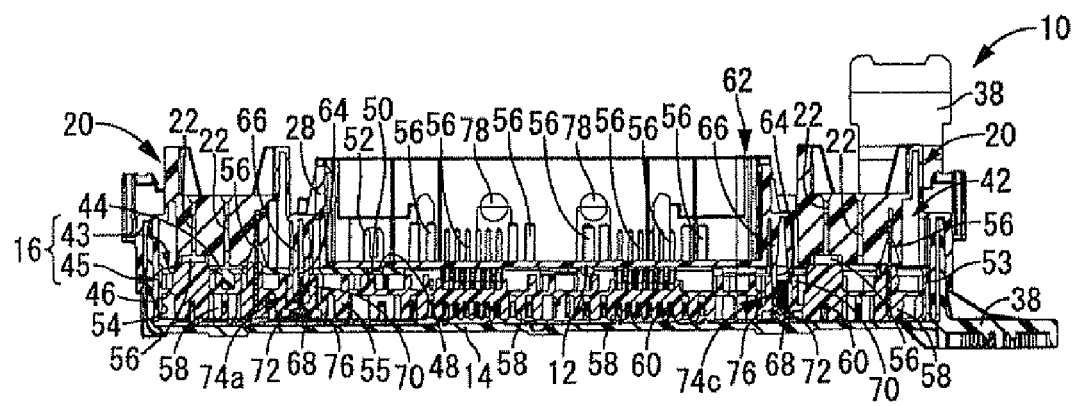

[Fig. 3]
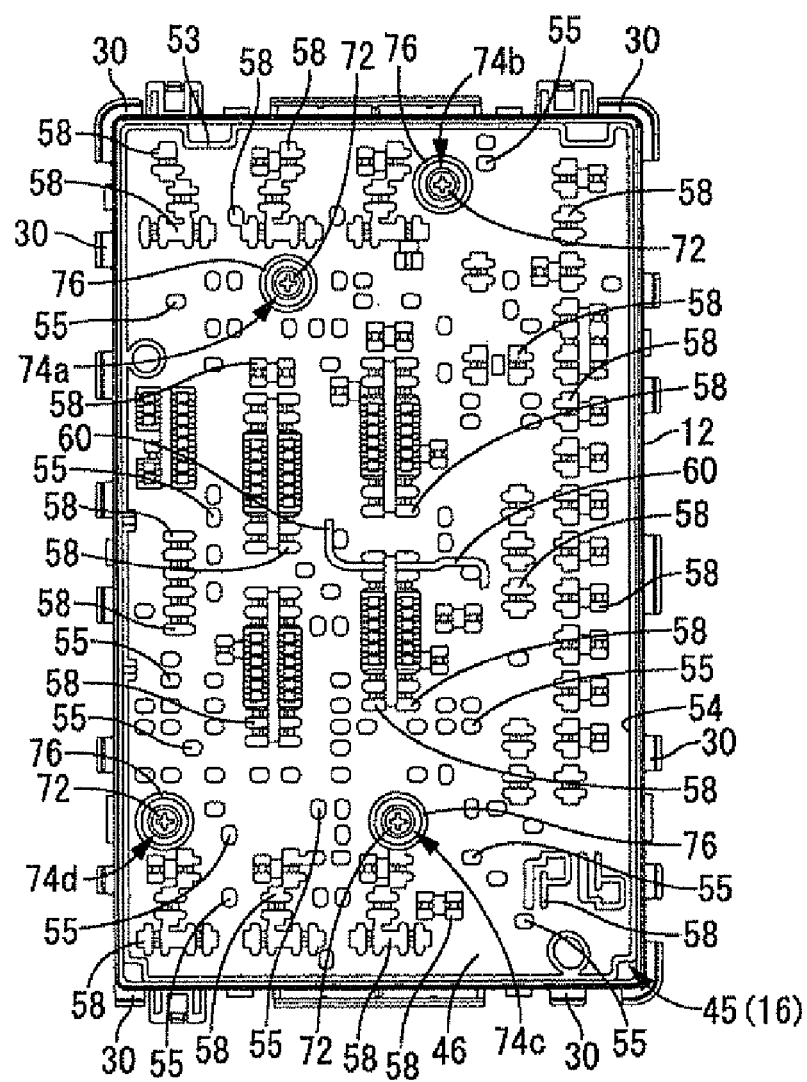

[Fig. 4]
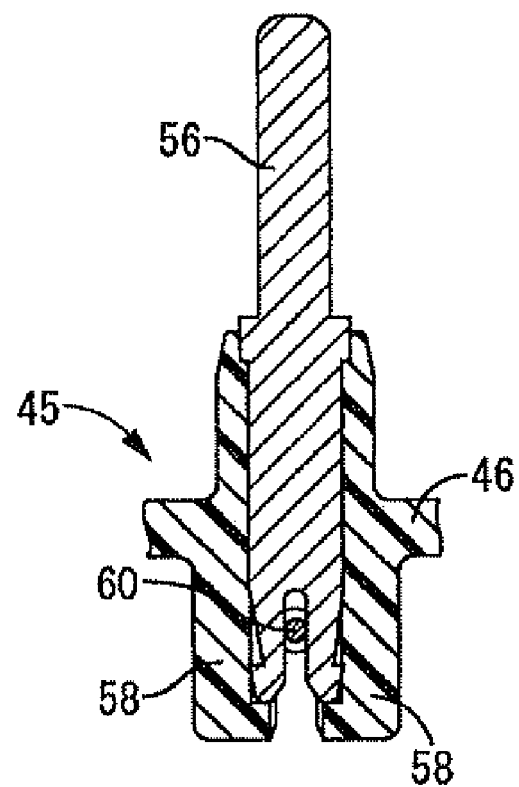

[Fig. 5]
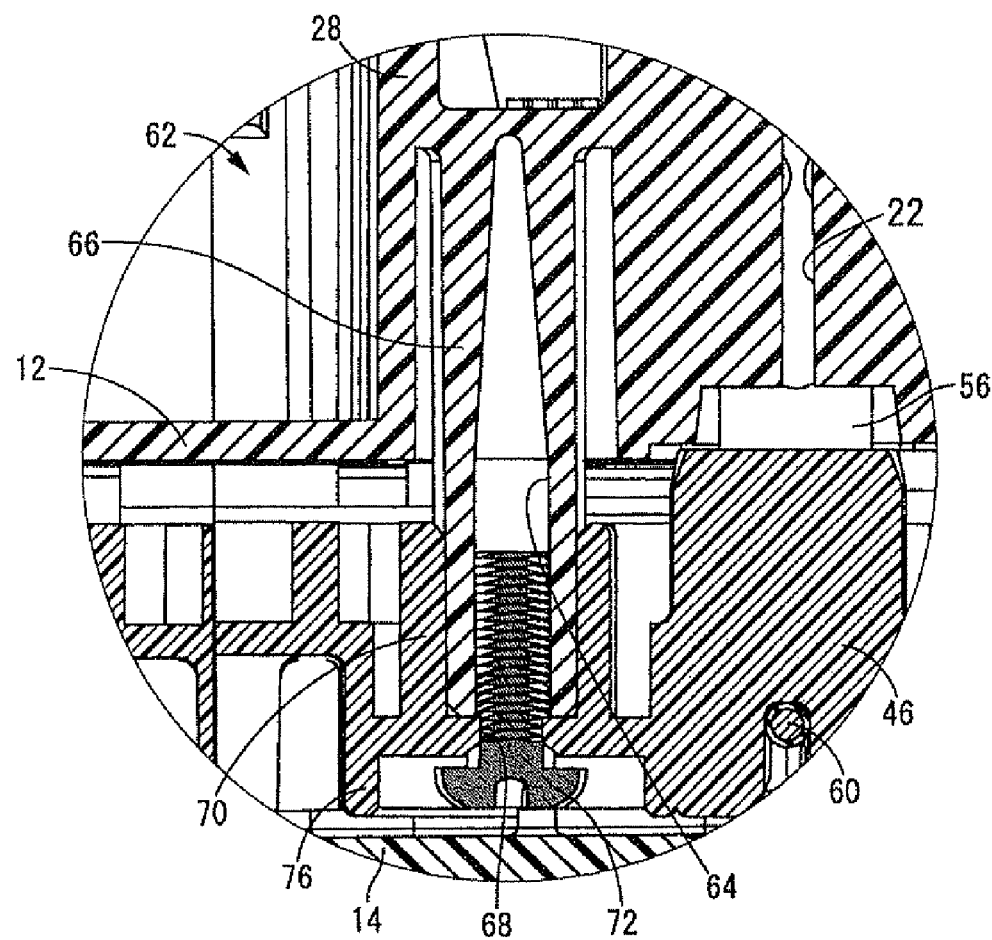

ELECTRONIC CONNECTION BOX

BACKGROUND

1. Field of the Invention

The present invention relates to an electric connection box to be mounted on an automotive vehicle or the like and, more specifically, to an electric connection box in which joint connectors for connecting external electrical wires are formed so as to open toward the outside of a case.

2. Description of the Related Art

In the related art, an electric connection box is used in an automotive vehicle or the like for the purpose of improvement of both efficiency of electric wiring and maintenanceability. JP-A-2007-181317 is an example of the related art. An internal circuit is formed in the interior of the electric connection box, and detachable connectors are employed for connecting external electrical wires to the internal circuit.

The connector generally includes a plurality of substrate terminals formed on a circuit substrate, which constitutes the internal circuit, so as to project therefrom. The plurality of substrate terminals project to the outside through insertion holes provided on a case of the electric connection box. The case is formed with connector peripheral wall portions which surround the peripheries of the plurality of substrate terminals.

However, the connectors having the structure as in the related art have a risk of occurrence of connection failure of the terminals when connecting the connectors. In other words, since the substrate terminals are provided on the circuit substrate, which is a separate member from the case having the connector peripheral wall portions to be fitted to external connectors, the projecting height of the substrate terminals tends to be small if the circuit substrate is deflected by a pressing force or the like applied when joining the connectors.

Therefore, there is a risk of occurrence of the connection failure such as resistance increase because of insufficient contact surface areas between the substrate terminals and external connecting terminals even when the external connectors are reliably fitted and connected to the connector peripheral wall portions.

In particular, when the substrate terminals are configured by fixedly press-fitting press-contact terminals to an insulating plate having electric wires such as covered single conductor cables laid thereon (hereinafter, referred to as a wired insulating plate), the press-contact portions of the press-contact terminals to the electric wires project with respect to the back surface of the wired insulating plate. Therefore, it is difficult to reinforce and support the portions of the wired insulating plate formed with the external connectors by a case or the like from the back surface, and hence the terminal-to-terminal connection failure due to the deflection of the substrate (wired insulating plate) might become a serious problem.

When the external connector has an elongated shape and a plurality of such elongated external connectors are arranged in parallel, spans (free lengths) of areas of the wired insulating plate, whose back surfaces are neither reinforced nor supported by the case or the like, are subjected to further deflection. Therefore, the deflection of the substrate of such portions is further increased, so that the above-described terminal-to-terminal connection failure might become a further serious problem.

Improvement of rigidity of the wired insulating plate by increasing the thickness is also conceivable. However, it results in an increase in size and weight of the entire electric connection box and an increase in cost due to an increase of required material. Therefore, it is hardly a sufficient countermeasure.

SUMMARY

In view of such circumstances, it is an object of the invention to provide an electric connection box having a novel structure in which a deformation of a wired insulating plate having electric wires laid thereon is restricted, so that the reliability of the connection of connectors can be improved.

Accordingly, a first aspect of the exemplary embodiments is directed to an electric connection box having: a case; a wired insulating plate with electric wires laid thereon and being accommodated in the case, the electric wires being respectively connected to a plurality of press-contact terminals secured on the wired insulating plate, the plurality of press-contact terminals projecting to the outside through the case on the side of a front surface of the wired insulating plate, and the case integrally including connector peripheral wall portions configured to surround the plurality of press-contact terminals projecting to the outside; and joining and fixing portions positioned on both sides of an alignment of the plurality of press-contact terminals in the longitudinal direction and fixing the wired insulating plate and the case with respect to each other.

In this configuration, in a structure in which the press-contact terminals are supported by the wired insulating plate for wiring electric wires thereon, the wired insulating plate is integrally connected to the case so that the bending rigidity of the wired insulating plate is enhanced. Therefore, the deflection of the wired insulating plate can be prevented or reduced. Accordingly, reduction of the projecting heights of the press-contact terminals from the case due to the deflection of the insulating plate is avoided, so that the connection failure of the press-contact terminals to the terminals on the side of the external connector is avoided.

In particular, the positions of the joining and fixing portions are set to both sides of a connector mounting portion with respect to the longitudinal direction, so that the bending rigidity of the wired insulating plate is secured reliably over the entire length of the portion on which a connector fitting load is exerted.

A second aspect of the exemplary embodiments is directed to the electric connection box of the first aspect, wherein, screw holes are formed on the case and the wired insulating plate respectively at corresponding positions, and the joining and fixing portions are configured by screwing connecting screws into the screw holes from the side of the wired insulating plate, and the wired insulating plate is formed with cylindrical restraining peripheral walls that surround the peripheries of the screw holes so as to project toward the opposite side from the case.

By employing the connecting screws as a connecting mode between the case and the wired insulating plate, the joint and fixation between the case and the wired insulating plate are realized in a simple structure with a high reliability.

In addition, with the provision of the peripheral walls which surrounds the peripheries of the openings of the screw holes on the side of the wired insulating plate where the head portions of the connecting screws are positioned, the electric wires are prevented from being laid on the screw holes, and hence the electric wires are prevented from being caught by the connecting screws. Therefore, the electric wires are prevented from becoming damaged and the connecting failure between the case and the wired insulating plate is prevented.

According to the aspects of the exemplary embodiments, the wired insulating plate which supports the press-contact terminals is integrally joined with the case at the joining and fixing portions, so that the bending rigidity of the wired insulating plate is enhanced and the deflection of the wired insulating plate is restrained. Consequently, the projecting heights of the press-contact terminals supported by the wired insulating plate from the front surface of the case can be maintained at an intended height, and hence the connection failure between the press-contact terminals and the external connecting terminals on the side of the external connectors can be avoided. In addition, the positions of the joining and fixing portions are set to both sides of the joint connector with respect to the longitudinal direction, so that the bending rigidity of the wired insulating plate is secured stably over the entire length of the portion on which a load generated by the fitting between the joint connector and the external connector is exerted.

BRIEF DESCRIPTION OF THE DRAWINGS

FIG. 1 is a plan view showing an electric connection box in an exemplary embodiment of the invention;

FIG. 2 is a vertical cross-sectional view of the electric connection box shown in FIG. 1;

FIG. 3 is a bottom view of the electric connection box shown in FIG. 1 in a state in which a lower case is removed;

FIG. 4 is an enlarged vertical cross-sectional view showing a portion of a wired insulating plate which constitutes the electric connection box shown in FIG. 1, where a press-contact terminal is supported; and FIG. 5 is an enlarged vertical cross-sectional view showing a principal portion of the electric connection box shown in FIG. 1.

DETAILED DESCRIPTION OF EMBODIMENTS

Referring now to the drawings, exemplary embodiments of the invention will be described.

In FIG. 1 and FIG. 2, an electric connection box 10 according to a first embodiment of the invention is shown. The electric connection box 10 has a structure including a circuit body 16 accommodated and arranged in a case having an upper case 12 and a lower case 14. In the description shown below, the vertical direction means the vertical direction in FIG. 2, which is the direction of projection of press-contact terminal 56 described below in principle.

The upper case 12 is a member formed of synthetic resin of a substantially rectangular box-shape opening downward. A plurality of fuse mounting portions 18 and relay mounting portions 20 as electric component mounting portions are provided on an outer peripheral portion of an upper surface thereof. The fuse mounting portions 18 and the relay mounting portions 20 each are formed with terminal insertion holes 22 which penetrate through an upper bottom wall portion of the upper case 12 in the thickness direction thereof.

The outer peripheral portion of the upper surface of the upper case 12 is provided with connector peripheral wall portions 24. The connector peripheral wall portions 24 each are formed into a cylindrical shape, and are formed integrally with the upper case 12 so as to project upward. In addition, formed inside the connector peripheral wall portions 24 are a plurality of terminal insertion holes 26 formed so as to penetrate through the upper case 12 in the thickness direction.

The upper surface of the upper case 12 is provided at a center portion thereof with a connector peripheral wall portion 28 which constitutes a multipolar connector. The connector peripheral wall portion 28 is formed into a rectangular cylindrical shape having a lateral cross-sectional shape of a substantially rectangular shape, and is integrally formed on the upper bottom wall portion of the upper case 12 so as to project upward therefrom. In addition, formed inside the connector peripheral wall portion 28 are the plurality of terminal insertion holes 26. The upper case 12 includes two connector peripheral wall portions 28a and 28b adjacent to each other in the short side direction. The longitudinal dimension of the connector peripheral wall portion 28 is larger than the connector peripheral wall portions 24, and a number of terminal insertion holes 26 are arranged in proper alignment in the same direction.

The upper case 12 is provided integrally at the outer peripheral portion thereof with a plurality of locking claws 30, so that the upper case 12 and the lower case 14 are fixed to each other by the locking claw 30 locked with the outer peripheral edge of the lower case 14, described later.

In contrast, the lower case 14 is formed of synthetic resin and is a substantially rectangular box-shaped member opened upward. The lower case 14 is formed with locking portions 36 which protrude from the lower end of the peripheral wall toward the outer periphery thereof.

In addition, the lower case 14, which is substantially rectangular in plan view, is formed at the outer peripheral edge thereof with three mounting portions 38. The respective mounting portions 38 project outward from the outer peripheral edge of the lower case 14, so that the lower case 14 is fixed to the automotive vehicle with fixing bolts, not shown, inserted through the respective bolt holes 40 formed at the center portions thereof and screwed into the automotive vehicle.

The upper case 12 and the lower case 14 are right opposed to each other in the vertical direction, so that the openings thereof oppose to each other correspondingly. The peripheral wall of the lower case 14 is fitted to the peripheral wall of the upper case 12, and the locking claws 30 of the upper case 12 and the locking portions 36 of the lower case 14 are locked to each other. Accordingly, the upper case 12 and the lower case 14 are fixed to each other so as to close the openings of the counterparts with respect to each other, and a storage space 42 isolated from the outside is formed between opposed surfaces of the upper bottom wall portion of the upper case 12 and the bottom wall portion of the lower case 14.

The storage space 42 includes the circuit body 16 disposed thereon. The circuit body 16 includes a bus bar circuit body 43 and a wired circuit body 45.

The bus bar circuit body 43 includes a bus bar insulating plate 44. The bus bar insulating plate 44 is a member formed of synthetic resin having electrical insulating properties, and is formed into a substantially rectangular plate shape having a sufficiently reduced thickness. In addition, a bus bar 50 is placed on the upper surface of the bus bar insulating plate 44. The bus bar 50 is a plate-shaped metal fitting formed of metal such as copper alloy, which is superior in conductivity, extends substantially in parallel to the upper surface of the bus bar insulating plate 44, and is placed on the bus bar insulating plate 44. The bus bar 50 is integrally formed with a plurality of terminal portions 52, which project upward at a substantially right angle with respect to the bus bar insulating plate 44. The bus bar 50 may be arranged either on the lower surface of the bus bar insulating plate 44 or on both the upper and lower surfaces.

In contrast, the wired circuit body 45 includes a wired insulating plate 46. The wired insulating plate 46 is formed of synthetic resin material having electrical insulating properties in the same manner as the bus bar insulating plate 44, and is formed into a substantially rectangular plate shape having a larger thickness than the bus bar insulating plate 44. As shown in FIG. 3, the wired insulating plate 46 is integrally formed at an outer peripheral edge of the wired circuit body 45 with a cylindrical outer peripheral wall 53 over the entire perimeter thereof so as to project on both sides in the thickness direction, so that recess-shaped wiring areas 54 surrounded by the outer peripheral wall 53 are formed on both sides of the wired insulating plate 46 in the thickness direction. The wired insulating plate 46 is integrally formed with a plurality of guide projections 55 projecting on both sides in the thickness direction.

The wired insulating plate 46 includes a plurality of press-contact terminals 56 attached thereto. The press-contact terminals 56 each are a plate-shaped metal fitting formed of metal such as copper alloy, which are superior in conductivity. The press-contact terminals 56 project at tip end portions thereof upward from the wired insulating plate 46 and project at base end portions thereof downward from the wired insulating plate 46. The base end portions of the press-contact terminals 56 each are bifurcated, and are secured to supporting projections 58 formed so as to project downward from the wired insulating plate 46. Opposed portions of the bifurcated base end portions are exposed to the outside and other portions are covered with the supporting projections 58. Projecting end surfaces of the supporting projections 58 are positioned substantially flush with the projecting end surfaces of the outer peripheral wall 53 and the guide projections 55.

The wiring areas 54 formed on the wired insulating plate 46 include covered single conductor cables 60 as electric wires laid therein. The covered single conductor cables 60 are electric wires each formed by covering an outer peripheral surface of a wire rod formed of conductive metallic material such as copper with insulative members such as soft polyvinyl chloride, and are laid on the wired insulating plate 46. The covered single conductor cable 60 is fitted into the bifurcated base end portion of the press-contact terminal 56, and hence is partly stripped by, and is in press-contact with, the press-contact terminal 56 as shown in FIG. 4. Accordingly, the press-contact terminals 56 and the external electric components are electrically connected via the covered single conductor cables 60. In FIG. 2 and FIG. 3, in which the wired insulating plate 46 is shown, illustration of the entire covered single conductor cable 60 is omitted, and only part of the covered single conductor cables 60 are illustrated.

The circuit body 16 is formed by the bus bar insulating plate 44 placed onto the wired insulating plate 46 from above in the direction of the thickness. The bus bar insulating plate 44 is partly overlapped with the wired insulating plate 46, so that some of the press-contact terminals 56 provided on the wired insulating plate 46 so as to project therefrom project upward from the bus bar insulating plate 44 through insertion holes, not shown, formed on the bus bar insulating plate 44.

The circuit body 16 having the structure as described above is placed between the upper case 12 and the lower case 14 and accommodated in the storage space 42 by placing the upper case 12 thereon from the front surface side, that is, the side of the projecting ends of the press-contact terminals 56 and placing the lower case 14 thereon from the back surface side, that is, the side of the base ends of the press-contact terminals 56. Some of the terminal portions 52 of the bus bar 50 and the press-contact terminals 56 are exposed to the outside by being inserted through the terminal insertion holes 22 formed on the upper case 12, and some of them other than those described above are penetrated through the upper case 12 via the terminal insertion holes 26 formed on the upper case 12.

In particular, the terminal portions 52 of the bus bar 50 and the press-contact terminals 56 are inserted through the terminal insertion holes 26 formed on the inner peripheral side of the connector peripheral wall portion 28 and project upward from the upper surface of the upper case 12 to a predetermined height. The plurality of terminal portions 52, the press-contact terminals 56, and the connector peripheral wall portion 28 which surround the peripheries of the terminal portions 52 and the press-contact terminals 56 constitute a joint connector 62. The joint connector 62 is a multipolar connector having the plurality of terminal portions 52 and the press-contact terminals 56. The direction of alignment of the terminal portions 52 and the press-contact terminal 56 is the longitudinal direction (vertical direction in FIG. 1), so that the joint connectors 62 have a substantially rectangular shape in plan view. The electric connection box 10 includes two joint connectors 62a and 62b adjacent with each other in the short side direction. The projecting heights of the terminal portions 52 and the press-contact terminals 56 from the surface of the upper case 12 are smaller than the projecting height of the connector peripheral wall portion 28, so that the terminal portions 52 and the press-contact terminals 56 are protected by the connector peripheral wall portion 28 and are prevented from becoming damaged due to contact with other members.

The circuit body 16 is positioned and supported in the thickness direction because the outer peripheral portion thereof and the portion where guide projections 55 are formed are in contact with the upper case 12 and the lower case 14. The circuit body 16 is also positioned in the direction substantially parallel to the surface because the outer peripheral portion thereof is in contact with the upper case 12.

The wired insulating plate 46 which constitutes the circuit body 16 is screwed to the upper case 12 at a plurality of positions as shown in FIG. 2 and FIG. 5, and the wired insulating plate 46 and the upper case 12 are integrally joined and fixed.

In other words, the upper case 12 is formed with a plurality of screw holes 64 on the both sides of the connector peripheral wall portion 28 with respect to the longitudinal direction. The screw holes 64 on the side of the upper case 12 are formed at projecting end portions of the plurality of inner cylindrical portions 66, which project downward from the upper bottom wall portion of the upper case 12. The screw holes 64 extend on center axes of the inner cylindrical portions 66.

In contrast, the wired insulating plate 46 is formed with outer cylindrical portions 70 that project upward and with a plurality of screw holes 68 on both sides of the supporting portions of the plurality of press-contact terminals 56, which constitute the joint connector 62, with respect to the longitudinal direction. The screw holes 68 are formed at positions corresponding to the screw holes 64 on the side of the upper case 12. The outer cylindrical portions 70 are formed integrally with the peripheries of the screw holes 64. The inner cylindrical portions 66 on the side of the upper case 12 and the outer cylindrical portions 70 on the side of the wired insulating plate 46 are formed at portions oppose to each other, and the outer diameter of the inner cylindrical portions 66 is set to be substantially the same as, or slightly smaller than, the inner diameter of the outer cylindrical portions 70.

Openings of the screw holes 64 formed at the projecting ends of the inner cylindrical portions 66 are connected in series with the screw holes 68 formed on the wired insulating plate 46 by the inner cylindrical portions 66 of the upper case 12 inserted into the outer cylindrical portions 70 of the wired insulating plate 46. Then, connecting screws 72 are screwed into the connected screw holes 64 and 68 from the wired insulating plate 46 side, so that the upper case 12 and the wired insulating plate 46 placed one on the other are fixed and integrally joined with respect to each other. To sum up, in the electric connection box 10, joining and fixing portions 74a to 74d, which join and fix the upper case 12 and the wired insulating plate 46, include the screw holes 64 and 68 and the connecting screws 72.

In addition, the electric connection box 10 is formed with the four joining and fixing portions 74a to 74d provided on the both sides of a set of the joint connectors 62a and 62b at positions deviated from the joint connectors 62a and 62b with respect to the longitudinal direction. The two joining and fixing portions 74a and 74c are formed in the proximity of the joint connector 62, and other two joining and fixing portions 74b and 74d are formed on the both sides of the joint connector 62 with respect to the longitudinal direction at positions apart therefrom in at least one of the longitudinal direction and the short side direction. The joining and fixing portion 74a is provided on the longitudinal one side of the joint connector 62a, and the joining and fixing portion 74c is provided on the other side in the longitudinal direction of the joint connector 62b. The joining and fixing portions 74a and 74c are arranged apart from each other substantially diagonally of the joint connectors 62a and 62b, respectively, in plan view. The joining and fixing portion 74b and the joining and fixing portion 74d are arranged apart from each other substantially diagonally of the joint connectors 62a and 62b, which is different from the direction of being apart from each other of the joining and fixing portions 74a and 74c.

The wired insulating plate 46 is formed with restraining peripheral walls 76 projecting toward a mating plane with respect to the lower case 14. The restraining peripheral walls 76 have a substantially cylindrical shape extending in the direction of the thickness of the wired insulating plate 46, have an inner diameter thereof larger than the diameter of the screw holes 68, and are formed so as to surround the peripheries of the openings of the screw holes 68. The projecting heights of the restraining peripheral walls 76 from the surface of the wired insulating plate 46 are substantially constant over the entire perimeters thereof, and are the same as, or slightly larger than, the heights of the head portions of the connecting screws 72. Projecting end surfaces of the restraining peripheral walls 76 are positioned substantially flush with the projecting end surfaces of the outer peripheral wall 53 of the wired insulating plate 46. In a joint state of the upper case 12 and the wired insulating plate 46 in which the connecting screws 72 are screwed into the screw holes 68, the head portions of the connecting screws 72 are accommodated in the inner peripheral sides of the restraining peripheral walls 76.

In the electric connection box 10 configured as described above, fuses, not shown, are mounted to the fuse mounting portion 18, and relays, not shown, are mounted to the relay mounting portions 20. A wire harness, not shown, as an external electrical wire is connected to the joint connector 62 and connectors on the outer peripheral portion including the connector peripheral wall portions 24 and the press-contact terminals 56. The wire harness includes a number of electrical wires, which connect electric components provided in respective portions of the automotive vehicle with the electric connection box 10, and has at an end thereof an external connector. The external connector is fitted into the connector peripheral wall portion 28, and the press-contact terminals 56 of the joint connector 62 are pushed into the external connecting terminals of the external connector, so that an electrically connected state in which the press-contact terminals 56 and the external connecting terminals are in contact with each other is maintained.

An engaging mechanism configured to aid fitting of the external connector to the joint connector 62 is provided between the external connector and the joint connector 62. The engaging mechanism is configured in such a manner that engaging claws provided on the side surface of the external connector are engaged with engaging projections 78 provided on the inner peripheral surface of the connector peripheral wall portion 28 and then levers that cause the engaging claws to swing are operated to cause the engaging claws to swing and displace about the engaging projections 78. Accordingly, an external force exerted to the levers is applied between the engaging claws and the engaging projections 78 after having been amplified by the principle of leverage, so that a force in the direction toward each other is effectively exerted between the external connector and the joint connector 62. Consequently, the external connector and the joint connector 62 can be fitted easily by a relatively small external force.

When connecting the external connector to the joint connector 62 as described above, a downward external force caused by frictional resistance or the like with respect to the external connecting terminal is exerted on the press-contact terminals 56, and hence the downward external force is transmitted to the wired insulating plate 46 which supports the press-contact terminals 56. At this time, since the wired insulating plate 46 is secured to the upper case 12 by screwing via the joining and fixing portions 74 and hence is joined and fixed integrally therewith, the bending rigidity of the wired insulating plate 46 is enhanced and the deflection is prevented. Consequently, the press-contact terminals 56 supported by the wired insulating plate 46 are maintained to have a substantially constant projecting height from the front surface of the upper case 12.

In addition, with the provision of the joining and fixing portions 74 on the both sides of the joint connector 62 with respect to the longitudinal direction, the displacement with respect to the upper case 12 on both sides of the portion of the wired insulating plate 46 where the joint connector 62 is formed, which is subject to the problem of deflection is prevented. Accordingly, the effect of reinforcement of the portion of the wired insulating plate 46 where the joint connector 62 is formed is effectively exerted over the entire longitudinal length thereof, so that the projecting height of the press-contact terminals 56 may be stably maintained.

Also, the sufficient effect of reinforcement is exerted by substantially increasing the cross-sectional area by the integration with the upper case 12 without increasing the thickness of the wired insulating plate 46. Therefore, upsizing of the electric connection box 10 can be prevented without necessity of increasing the thickness of the wired insulating plate 46 at the portion reinforcing the wired insulating plate 46.

Since the upper case 12 and the wired insulating plate 46 are joined and fixed with the screwing structure using the connecting screws 72, the joint and fixture between the upper case 12 and the wired insulating plate 46 are realized with a simple structure and a high reliability.

In addition, with the provision of the restraining peripheral walls 76 around the screw holes 68 so as to project to the opposite side from the upper case 12 on the wired insulating plate 46, the route of the covered single conductor cables 60 to be laid on the wired insulating plate 46 is controlled to prevent the covered single conductor cables 60 from extending over the opening of the screw holes 68. Therefore, damages of the covered single conductor cables 60 caused by being caught at the time of tightening the connecting screws 72 are prevented and the joint failure caused by the covered single conductor cable 60 being caught can be avoided.

Although the embodiments of the invention have been described, the invention is not limited by the detailed description. For example, the number of the joining and fixing portions does not necessarily have to be four, and what is essential is that at least one each of those are provided on the both sides of the joint connector 62 with respect to the longitudinal direction. However, if at least two each of those are provided on the both sides, the upper case 12 and the wired insulating plate 46 are joined further reliably.

The joining and fixing portions do not have to have the screwing structure and, for example, a configuration in which joint projections projecting from the side of the wired insulating plate are fitted and fixed to connecting cylinders provided on the side of the case to join the wired insulating plate and the case with each other is also applicable. For example, the joining and fixing portions may be configured by providing projections on both the wired insulating plate and the case, and fixing tip end faces of the projections to each other by adhesion, welding, and the like. When the joining and fixing portions on the basis of screwing are employed, the invention is not limited to the detailed structure described in the embodiment and, for example, the fitting structure between the inner cylindrical portions 66 and the outer cylindrical portions 70 is not compulsory.

The joint connectors do not necessarily have to be the two joint connectors provided adjacently, and a structure in which one joint connector or three or more joint connectors are formed and joining and fixing portions are provided on the both sides of the joint connector with respect to the longitudinal direction may also be employed.

What is claimed is:

1. An electric connection box comprising:
a case having an upper case;
a wired insulating plate accommodated in the case and directly fixed to the case, the wired insulating plate having a front surface and having electric wires laid on the plate;
a plurality of press-contact terminals being in alignment and secured on the wired insulating plate, the electric wires being respectively connected to the plurality of press-contact terminals, the plurality of press-contact terminals projecting outside and through the case on a side of the front surface of the wired insulating plate;
connector peripheral wall portions integrally formed with the case and configured to surround the plurality of press-contact terminals;
a first joint connector and a second joint connector formed on the wired insulating plate; and
joining and fixing portions positioned on both sides of the aligned plurality of press-contact terminals in a longitudinal direction of the case, the wired insulating plate being fixed to the case, wherein
the upper case and the wired insulating plate are integrally joined when placed one on the other,
the first and second joint connectors are arranged adjacent with each other,
the joining and fixing portions include first, second, third and fourth joining and fixing portions, the first and third joining and fixing portions being arranged substantially diagonally apart from each other from the first and second joint connectors, and
the second and fourth joining and fixing portions are arranged substantially diagonally apart from each other from the first and second joint connectors that is different from the direction of being apart from each other of the first and third joining and fixing portions.

2. The electric connection box according to claim 1, wherein screw holes are formed in the case and in the wired insulating plate respectively at corresponding positions, and the joining and fixing portions are configured by screwing connecting screws into the screw holes from a side of the wired insulating plate, and
the wired insulating plate has cylindrical restraining peripheral walls that surround the peripheries of the screw holes so as to project toward an opposite side from the case.

3. An electric connection box comprising:
a case having an upper case and a lower case;
a wired insulating plate having a front surface and being disposed between the upper case and the lower case, the wired insulating plate being directly fixed to the case, and having electric wires laid on the plate;
a plurality of press-contact terminals secured on the wired insulating plate, the electric wires being respectively connected to the plurality of press-contact terminals, the plurality of press-contact terminals projecting outside of and through the upper case, and the upper case being integral with connector peripheral wall portions configured to surround the plurality of press-contact terminals;
a first joint connector and a second joint connector formed on the wired insulating plate; and
a plurality of joining and fixing portions positioned on both sides of the plurality of press-contact terminals in a longitudinal direction of the case, the plurality of joining and fixing portions fixing the wired insulating plate and the upper case with respect to each other, wherein
the upper case and the wired insulating plate are integrally joined when placed one on the other,
the first and second joint connectors are arranged adjacent with each other,
the joining and fixing portions include first, second, third and fourth joining and fixing portions, the first and third joining and fixing portions being arranged substantially diagonally apart from each other from the first and second joint connectors, and
the second and fourth joining and fixing portions are arranged substantially diagonally apart from each other from the first and second joint connectors that is different from the direction of being apart from each other of the first and third joining and fixing portions.

4. The electric connection box according to claim 3, wherein screw holes are formed in the upper case and the wired insulating plate respectively at corresponding positions, and the plurality of joining and fixing portions each are configured by screwing connecting screws into the screw holes from a side of the wired insulating plate, and
the wired insulating plate is formed with cylindrical restraining peripheral walls that surround the peripheries of the screw holes so as to project toward the lower case.

5. The electric connection box according to claim 4, wherein the screw holes of the upper case are formed by projecting end portions of a plurality of inner cylindrical portions that project toward the lower case from an upper bottom wall portion of the upper case.

6. The electric connection box according to claim 5, wherein the wired insulating plate includes outer cylindrical portions that project toward the upper case.

7. The electric connection box according to claim 6, wherein an outer diameter of the inner cylindrical portions is substantially the same as an inner diameter of the outer cylindrical portions.

* * * * *